United States Patent
Staker et al.

(10) Patent No.: US 6,935,759 B1
(45) Date of Patent: Aug. 30, 2005

(54) FOLDED LONGITUDINAL TORSIONAL HINGE FOR GIMBALED MEMS MIRROR

(75) Inventors: Bryan P. Staker, Pleasanton, CA (US); William C. Banyai, San Francisco, CA (US)

(73) Assignee: Glimmerglass Networks, Inc., Hayward, CA (US)

( * ) Notice: Subject to any disclaimer, the term of this patent is extended or adjusted under 35 U.S.C. 154(b) by 192 days.

(21) Appl. No.: 10/080,064

(22) Filed: Feb. 19, 2002

(51) Int. Cl.[7] ............................................. G02B 7/182
(52) U.S. Cl. ..................... 359/872; 359/871; 359/877
(58) Field of Search ................................ 359/872, 871, 359/877–878, 199, 223–226; 438/48–52; 382/124–127; 73/504.02, 504.12

(56) References Cited

U.S. PATENT DOCUMENTS

| | | | | |
|---|---|---|---|---|
| 4,337,506 A | * | 6/1982 | Terada | 362/142 |
| 4,598,585 A | * | 7/1986 | Boxenhorn | 73/504.12 |
| 4,721,274 A | * | 1/1988 | Erb | 248/179.1 |
| 5,016,072 A | * | 5/1991 | Greiff | 257/418 |
| 5,488,862 A | * | 2/1996 | Neukermans et al. | 73/504.02 |
| 5,648,618 A | * | 7/1997 | Neukermans et al. | 73/862.08 |
| 6,337,760 B1 | * | 1/2002 | Huibers et al. | 359/291 |
| 6,379,510 B1 | * | 4/2002 | Kane et al. | 204/192.34 |

* cited by examiner

Primary Examiner—Mohammad Sikder
(74) Attorney, Agent, or Firm—Townsend and Townsend and Crew LLP; Kenneth R. Allen

(57) ABSTRACT

In a gimbaled micromachined micromirror array optimized for parallel-plate electrostatic operation, longitudinal-type gimbal hinge elements are provided in which a plurality of torsional longitudinal hinge elements are arranged in an array parallel to the axis of rotation and which are linked together by rigid lateral brace sections. In primary embodiment the hinge elements are arranged in a double gimbal configuration. Specific embodiments of the hinge elements are simple longitudinal, compound longitudinal, stacked simple longitudinal, and stacked compound longitudinal. The longitudinal hinges may be used with various types of mirrors including circular or rectilinear, recessed or nonrecessed, where the hinges are connected in either a symmetric or asymmetric configuration relative to one another, as hereinafter illustrated by way of a subset of examples. A preferred embodiment of a mirror structure suitable for an array structure according to the invention is a nonstacked compound longitudinal hinge symmetrically connected to a circular nonrecessed electrostatically-actuatable parallel plate mirror within a substantially circular ring hinged in substantially the same way to form a double gimbaled structure.

28 Claims, 15 Drawing Sheets

FOLDED LONGITUDINAL TORSIONAL HINGE FOR GIMBALED MEMS MIRROR

CROSS-REFERENCES TO RELATED APPLICATIONS

NOT APPLICABLE.

STATEMENT AS TO RIGHTS TO INVENTIONS MADE UNDER FEDERALLY SPONSORED RESEARCH OR DEVELOPMENT

NOT APPLICABLE.

REFERENCE TO A "SEQUENCE LISTING," A TABLE, OR A COMPUTER PROGRAM LISTING APPENDIX SUBMITTED ON A COMPACT DISK.

NOT APPLICABLE.

BACKGROUND OF THE INVENTION

This invention relates to double-axis micromirrors such as MEMS arrays and hinges therefore used with parallel plate electrostatic actuation.

Micromachined double-axis micromirrors are used in communication for optical components, such as optical switches, attenuators, and modulators. These mirrors typically include either circular or square flat reflective surfaces fabricated of either single-crystal silicon or polysilicon. The mirrors are attached to a surrounding support region by the use of either a flexure or a double gimbaled structure whereby a gimbal ring is connected to the support structure by a pair of hinge elements along an axis bisecting the support ring, and the gimbal ring is coupled to a mirror within the gimbal ring by a pair of second hinge elements along a second axis bisecting the ring and transverse, preferably orthogonal, to the first axis. The purpose of the flexure and/or hinge elements is to allow free double-axis movement of the mirror.

The electrostatic actuation methods of micromachined mirror arrays generally fall into two categories; those involving parallel-plate electrostatic actuation and those involving comb-drive electrostatic actuation. In the case of comb-drive actuation, comb-drive actuators develop forces between interdigitated combs that are located outside the boundary of and away from the mirror elements. The actuators are connected to the mirror by the use of linkage elements which are typically in contact with each other. Advantages of this technique are that the electrostatic forces in question are decoupled from the mirror design, allowing conceivably lower voltages for a given force. Disadvantages are difficulty in designing double-axis mirrors so they can reside in a compact region of space, difficulty in manufacturing, difficulty in interconnection, and potential for undesired contact with adjacent components and regions, which is a known serious reliability issue for MEMS devices.

In the case of electrostatic parallel plate actuation, forces are developed between the mirror and one or more electrodes embedded in the substrate. The electrostatic forces applied to the mirror are purely attractive. Because there are no repulsive forces on the mirror, the same forces that contribute to mirror rotation (which is desirable) also contribute to a vertical sag component of the mirror (which is undesirable). Advantages of micromachined electrostatic mirrors that utilize parallel-plate actuation are ease of design, ease of manufacture, and ease of compact interconnection, i.e., such mirrors can be deployed with efficient fill factors. In most cases, these designs are also non-contact in that the actuation element is not directly coupled to the mirror. A disadvantage is that the electrostatic force applied to the mirrors is interactive with the mirror design. This can either limit resonant frequencies (and therefore switching times), limit maximum tilt angles, or dictate higher design voltages.

A micromachined mirror may be connected to a surrounding support structure by means of either isolated flexure elements or hinge elements in combination with a gimbal which surrounds the mirror. Flexure elements can eliminate the need of a gimbal structure. The number of flexure elements is not necessarily restricted by design, since the rotation of the mirror is given by overall flexure compliance.

One example of a flexure support structure without gimbals was built by Dr. Li Fan, currently associated with by Optical Micro-Machines, Inc. (OMM) of San Diego, Calif. In this structure, four single-beam flexure elements are connected at four corners of a square mirror to the surrounding support region and extended along adjacent edges of the mirror. The flexure elements operate in a leaf spring mode. A major drawback of this structure is that the same type of flexure beam bending that accomplishes rotation also contributes to sag. Because electrostatic forces are only attractive, as the mirror rotates, it will undergo sag, reducing the amount of overall possible rotation for a given design.

Another type of micromachined double-axis mirror utilizes a gimbal. In this configuration, a micromachined mirror is connected to a surrounding support region by means of hinge elements in combination with a gimbal which surrounds the mirror. Each rotational axis is connected to the gimbal by two opposing hinge structures, for a total of four rotational hinge structures.

An example of a gimbal in combination with four rotational hinge structures has been developed by Lucent Technologies and Agere Systems Optoelectronics Guardian Corp. and described in U.S. Pat. No. 6,265,239B1 issued Jul. 24, 2001. In this example, two hinge elements per degree of freedom are connected between the mirror and the gimbal, and provided with a multiply-meandered transverse hinge structure. The transverse meanders are aligned so that the long axis of the hinge elements are transverse, or perpendicular to the axis of rotation. Rotation is accomplished by each of the hinge elements bending along the long direction in small paraboloidal sections. As in the flexure support structure, a significant drawback of this design is that the same beam movement which supplies rotational motion also supplies a sag and lateral translation element. Because of this typical designs utilizing transverse meandered hinges have the drawback that for some design spaces, the movement can be significant. This may either limit the maximum rotation angle of the mirror, or create an undesirable piston mode of oscillation which may interfere with the fundamental torsional modes of oscillation.

U.S. Pat. No. 6,044,705 shows a torsional bar design suitable primarily for a larger mirror array than of interest. However, it fails to recognize or address problems which occur in compact structures where the size of the hinge and mirror are impacted by forces and factors consistent with electrostatic actuation forces.

Other patents concerning double-gimbaled micromachined mirrors include 5,488,862; 5,648,618; 5,895,866; 6,122,394; 6,060,479; 6,044,705; 5,969,465; 5,629,790; 5,841,533; 5,016,072; 4,317,511; and 4,598,585. These patents have been listed for completeness, but they are not believed to be directly relevant prior art.

It is difficult to determine the proper combination and values of factors that can be optimized and compromised in order to produce a suitable size of an array of mirrors and a suitable mirror size. The problem is thus one of determining a design space which optimizes all relevant considerations. Factors to be included are primary torsional spring constants, secondary torsional spring constants, vertical and lateral linear spring constants (for shock considerations), hinge compactness, manufacturability, and process dependent tolerancing.

As an illustration of a hinge structure which is believed to be of the prior art but which does not meet all desired criteria, reference is made to FIGS. 9, 10 and 11. In FIG. 9, a torsional hinge structure is shown in the form of a transverse serpentine structure. The transverse hinge structure has a plurality of serpentine hinge elements 90–93 linked together by rigid braces 99, 101–106. However, the hinge elements are orientated perpendicular to the axis of rotation 114. This has several important consequences in design. First, overall rotation is accomplished only by parabolic beam bending along the length of the entire beam. This is understood by examining FIG. 10. Connection point 112 is fixed, and an external torque is applied at connection point 110. Rotation is accomplished as elements 90–93 bend into opposing paraboloidal sections as demonstrated in FIG. 11, which is a side view of FIG. 10 with exaggerated rotation. The effective torsional spring constant for this structure is given by the expression:

$$k_\theta = \frac{Ewt^3}{6NL(1-v^2)}$$

where $k_p$ is effective transverse torsional spring constant,
w is hinge width,
L is hinge length,
N is number of hinge elements, and
E is Young's modulus.

An important consideration is that the same motion that contributes to sag also contributes to rotation, i.e., beam bending along the length of each of the hinge elements. This has important consequences in device performance, as electrostatic forces which give rise to adequate movement for rotation will also give rise to significant sag.

What is needed is a manufacturable flexure element that is useable as a hinge for a miniature steerable mirror that allows for a compliant torsional rotation while simultaneously restricting net vertical and horizontal displacement.

SUMMARY OF THE INVENTION

According to the present invention in a gimbaled micromachined micromirror array optimized for parallel-plate electrostatic operation, longitudinal-type gimbal hinge elements are provided in which a plurality of torsional longitudinal hinge elements are arranged in an array parallel to the axis of rotation and which are linked together by rigid lateral brace sections. In a primary embodiment the hinge elements are arranged in a double gimbal configuration. Specific embodiments of the hinge elements are simple longitudinal, compound longitudinal, stacked simple longitudinal, and stacked compound longitudinal, as hereinafter explained. The longitudinal hinges may be used with various types of mirrors including circular or rectilinear, recessed or nonrecessed, where the hinges are connected in either a symmetric or asymmetric configuration relative to one another, as hereinafter illustrated by way of a subset of examples. A preferred embodiment of a mirror structure suitable for an array structure according to the invention is a nonstacked compound longitudinal hinge symmetrically connected to a circular nonrecessed electrostatically-actuatable parallel plate mirror within a substantially circular ring hinged in substantially the same way to form a double gimbaled structure having a size typically of about 1 mm in diameter. The mirror structures can be scaled from about 5 mm to 0.2 mm in diameter while retaining the desired characteristics.

The invention provides a manufacturable flexure element that is useable as a hinge for a miniature steerable mirror that allows for a compliant torsional rotation while simultaneously restricting net vertical and horizontal displacement.

The invention will be better understood by reference to the following detailed description in connection with the accompanying drawings.

DESCRIPTION OF SPECIFIC EMBODIMENTS

Figure 1:
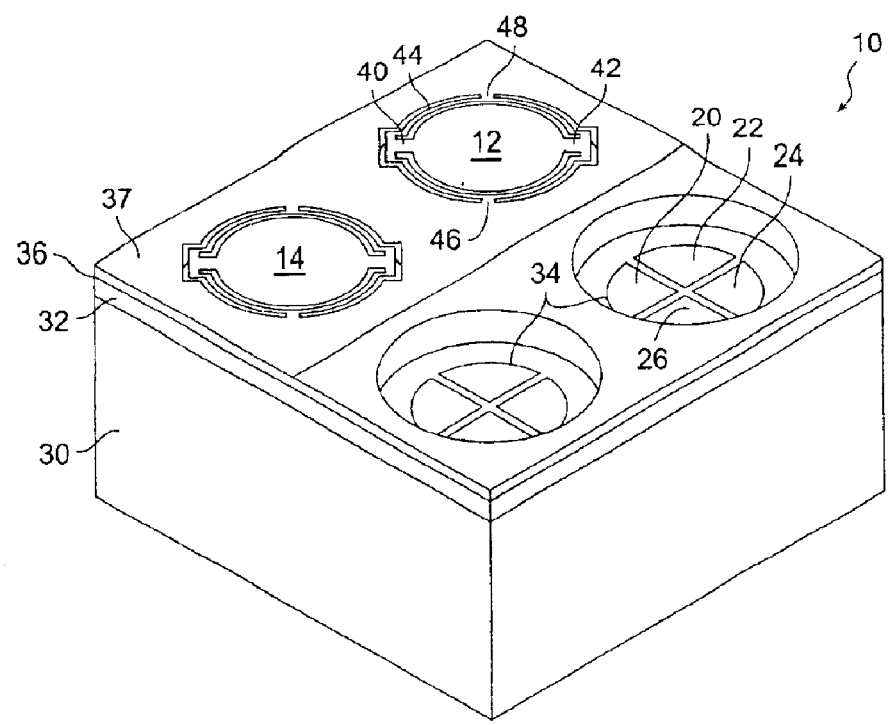
FIG. 1 is perspective view of an array of double-gimbaled mirrors.

Referring to FIG. 1, a cross-sectional view of an array of double gimbaled mirrors 10 according to the invention is depicted. Parallel-plate electrostatic actuation electrodes 20, 22, 24, and 26 are configured on a substrate 30 which may either be insulative or partially conductive. The substrate may be either a silicon, glass, or a ceramic substrate. Onto this substrate is either bonded or attached a stand-off separation layer 32 into which have been formed cavities 34. The separation layer 32 is typically between 50 microns and 500 microns in height. Onto this layer 32 is deposited or grown a thin etch stop layer 36. The etch stop layer 36 is formed between the stand-off separation layer 32 and a device structure layer 37. This layer 36 is typically less than one micron in thickness. Next is the device structure layer 37 upon which is formed mirrors 12 and 14, hinges 40, 42, 46, and 48, and a gimbal 44. The device structure layer 37 is typically between 2 microns and 10 microns thick. Depending on the process, multiple depositions may be used to form the mirror thickness, allowing the hinge thickness to be decoupled from the mirror thickness.

For simpler processes, the device structure layer is formed of single-crystal silicon so that the thickness of the hinge elements is the same as that of the mirror thickness. Hinges 40, 42, 46, and 48 are a specific type of torsional hinge referred to as longitudinal hinges. For the purposes of the following discussion, these devices may be assumed be rotationally compliant along the longitudinal axis which bisects the mirror center, but non-compliant laterally in all directions. In this case, a suitable design must be found which achieves acceptable torsional spring constants and mirror flatness given the thickness constraint.

Figure 2:
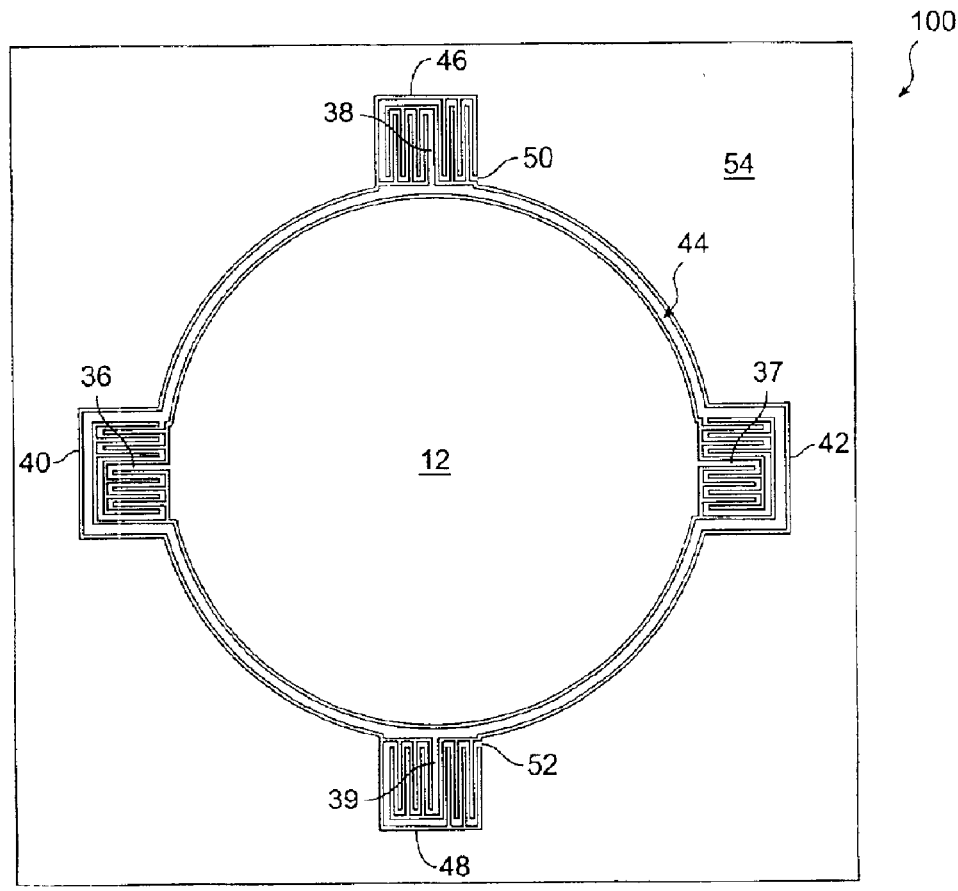
FIG. 2 a top view of a specific embodiment of a circular double-gimbaled mirror with compound hinges according to the invention.

FIG. 2 is a top view of a preferred embodiment of a double-gimbaled mirror structure 100. In this figure, a circular mirror 12 is connected to the gimbal 44 at opposing, but offset from center axis locations 36 and 37 and by compound longitudinal hinges 40 and 42. By compound it is meant that the hinge has an interstitial structure which folds back upon itself. Connection of the base 54 to the gimbal 44 is also via compound longitudinal hinges 46, 48 at opposing locations 38 and 39, but in this case the hinge connection point of the gimbal 44 is substantially centered, while the hinge connection points to the base 54 are offset. The center of the axis of symmetry of the compound hinges corresponds to the axis of symmetry of the mirror. The gimbal 44 is largely circular except near the compound longitudinal hinges 40 and 42 where it wraps around the hinges as necessary. Compound hinges 46 and 48 are connected to the gimbal at locations 50 and 52, along the other axis of symmetry of the mirror. Finally, connection is made to the surrounding region 54 to the outside compound hinges 46 and 48.

This structure has several advantages over the prior art. An advantage is the design of the torsional hinge elements 40, 42, 46, and 48. These elements have been designed to achieve specific torsional spring constants maintained within specified tolerances consistent with silicon polishing which results in a single structure silicon thickness of between 2 microns and 20 microns. These structures are compliant along a single longitudinal rotational axis but are non-compliant in all three lateral dimensions, a requirement of torsional hinge designs for electrostatically actuated parallel plate double-axis mirror designs. The elements have the added benefit of residing in a compact region of space, a requirement for high-port count optical switch systems.

Figure 3:
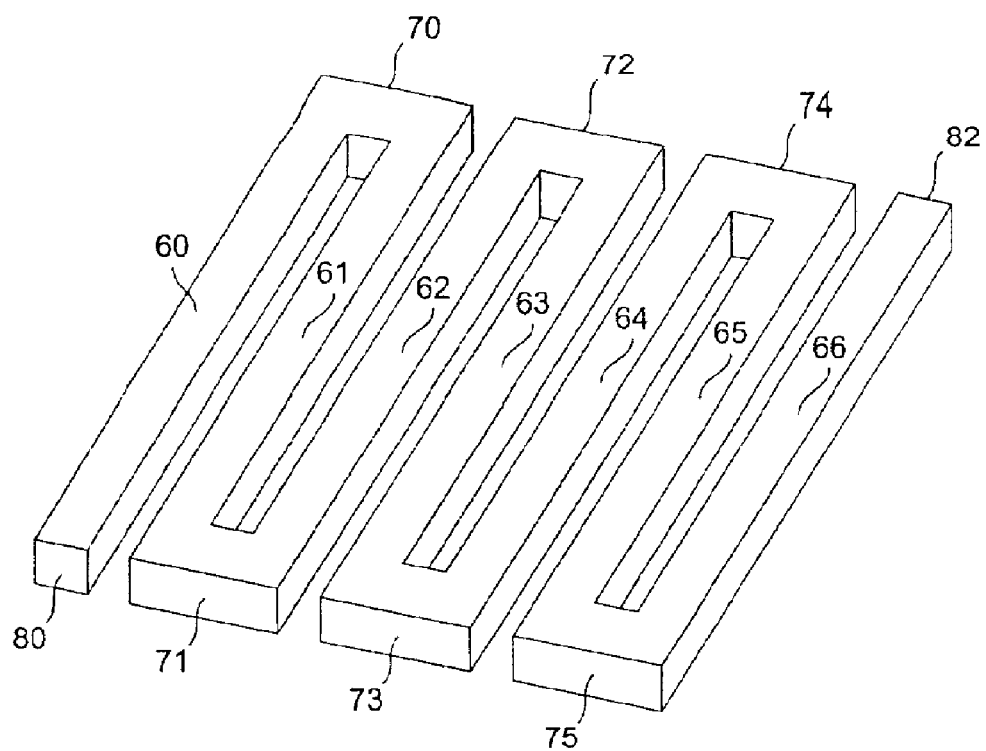
FIG. 3 is a perspective view of a detail of a simple longitudinal hinge useful in a mirror according to the Invention.

FIG. 3 depicts the simplest possible embodiment of a serpentine longitudinal hinge. This structure consists of a plurality of torsional hinge elements 60–66 arranged in an array configured parallel to the axis of rotation. These hinge elements are linked together in serpentine fashion by rigid lateral braces 70–75. Connection points from either a surrounding support region to gimbal or from gimbal to mirror (regions 54, 44, and 12 of FIG. 2) are made at locations 80 and 82. Typical hinge elements are configured such that the aspect ratio of thickness to the width is greater than or equal to one and the length is substantially greater than the width or height. The torsional spring constant of N hinge elements taken as a group is given by the textbook expression (valid for t>w):

$$k_\theta = \frac{Ew^3 t}{2NL(1+v)} \left[ \frac{1}{3} - 0.21 \frac{w}{t} \left( 1 - \frac{w^4}{12t^4} \right) \right]$$

where $k_\theta$ is Longitudinal torsional spring constant and v is the Poisson ratio.

Figure 4:
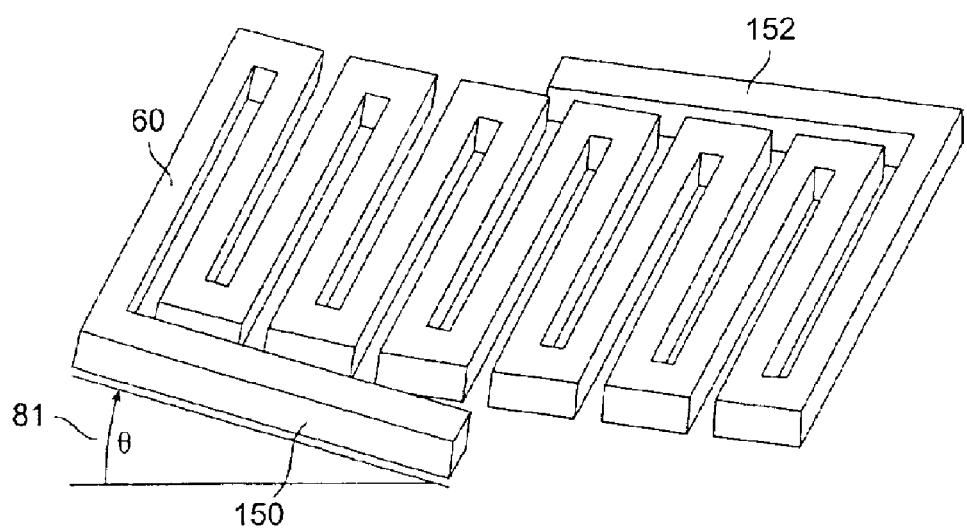
FIG. 4 is a perspective view of a detail of a rotated simple longitudinal hinge useful in a mirror according to the invention.

FIG. 4 depicts the longitudinal serpentine hinge of FIG. 3 with cantilevered bars 150, 152 after the hinge has been rotated through a total angle 81. Each rung element 60, etc., is rotated through the total angle divided by N where N is the number of rungs. Because of the extended nature of the serpentine hinge, the outer element 60 is deflected in the vertical direction by a small distance.

Figure 5:
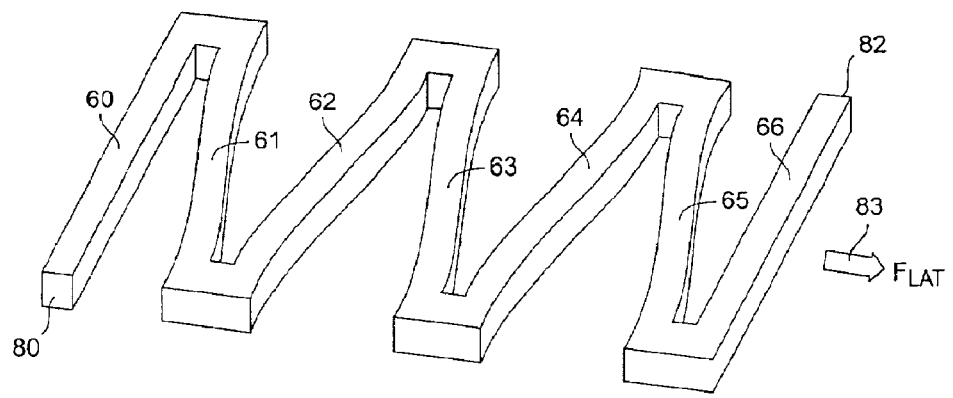
FIG. 5 is a perspective view of a laterally-expanded simple longitudinal hinge.

For robustness considerations, mirrors must be designed to withstand hundreds of gravities of acceleration, where a single gravity is defined as one earth gravity. For example, a laterally applied shock force will cause the mirror to deflect in a direction that may cause the hinges to compress or expand along the lateral axis. Therefore, an important design consideration for hinge elements is the translational compliance in the lateral and vertical directions. FIG. 5 depicts an expanded serpentine longitudinal hinge. Connection element 60 is fixed and a separation force 83 is applied to element 66 in a lateral direction away from element 60. Elements 61–65 deflect, giving rise to a net displacement. A lateral spring constant is defined as the ratio of the applied force to the net displacement. This lateral translational spring constant is calculated to be:

$$k_{lateral} = \frac{Ew^3 t}{NL^3}.$$

Given the lateral spring constant, the calculation of unwanted lateral deflection as a function of shock is straightforward. Given an impact shock of $N_g$, where $N_g$ is the number of gravities applied, g is the acceleration due to gravity, and mirror mass m, assuming a quasi steady-state force, the mirror will deflect a lateral distance $$\frac{N_g mg}{k_{lateral}}$$

Figure 6:
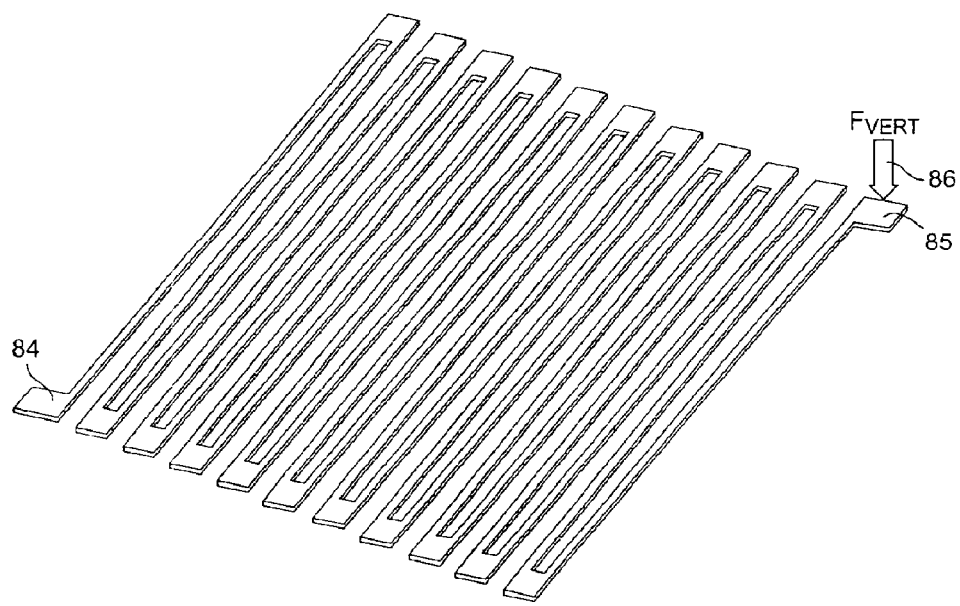
FIG. 6 is a perspective view of a vertically linearly translated simple longitudinal hinge.

A more complicated situation arises for the calculation of the vertical displacement as a function of shock. In this case, because of the extended nature of the serpentine hinge and the fact that motion is no longer confined to a plane, there are two primary types of sag motion. The first type of sag is depicted in FIG. 6. It is configured such that the aspect ratio of thickness to the width is greater than or equal to one, and the length is substantially greater than the width or height. The connection element 84 is fixed. However a vertical downward force 86 instead of lateral force is applied. A vertical spring constant $k_{v1}$ is calculated to be $$k_{v1} = \frac{Ewt^3}{NL^3}.$$

Figure 7:
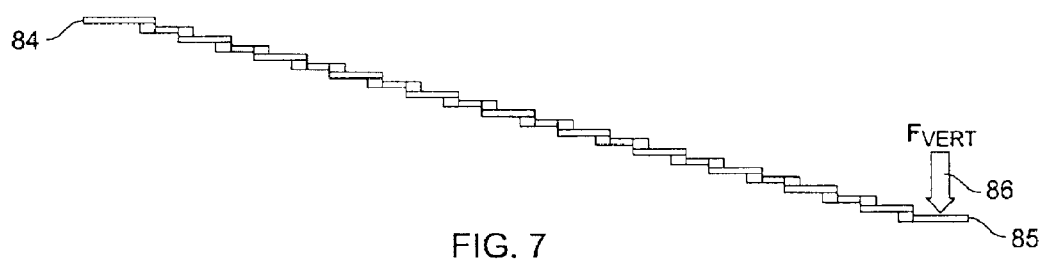
FIG. 7 is a side view of a vertically linearly translated simple longitudinal hinge.

FIG. 7 is a cross-sectional view of FIG. 6. In this case each rung element is deflected a uniform distance.

Figure 8:
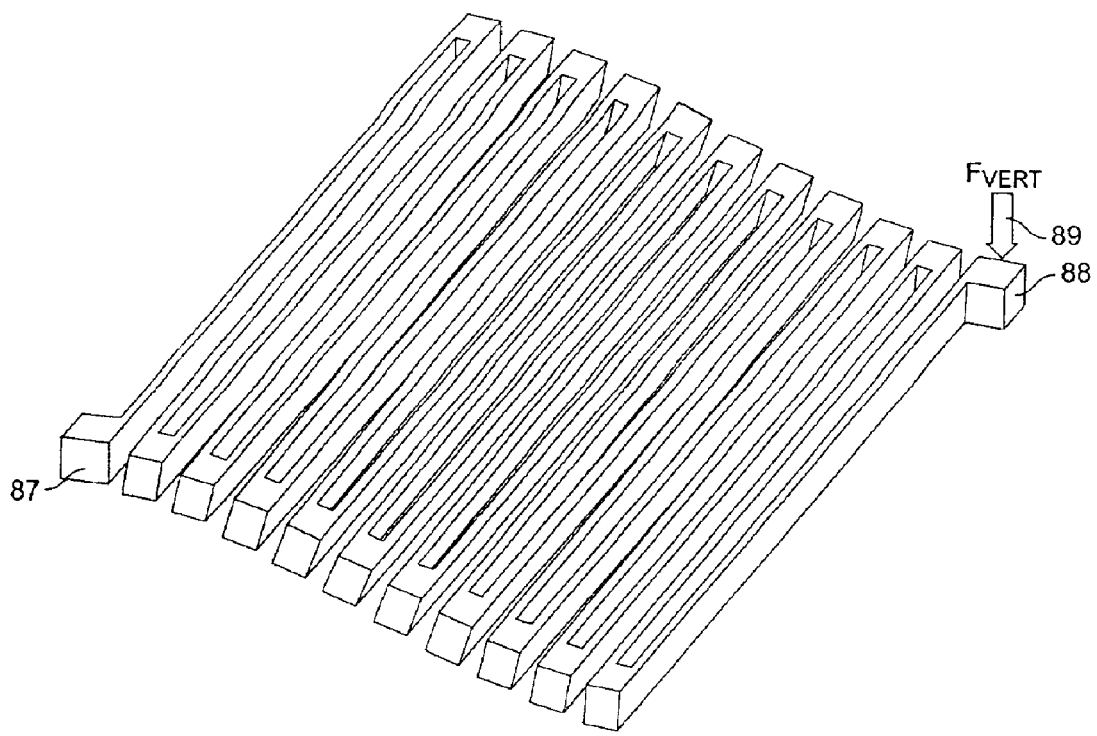
FIG. 8 is a perspective view of a vertically displaced cubic S-bend simple longitudinal hinge.
Figure 9:
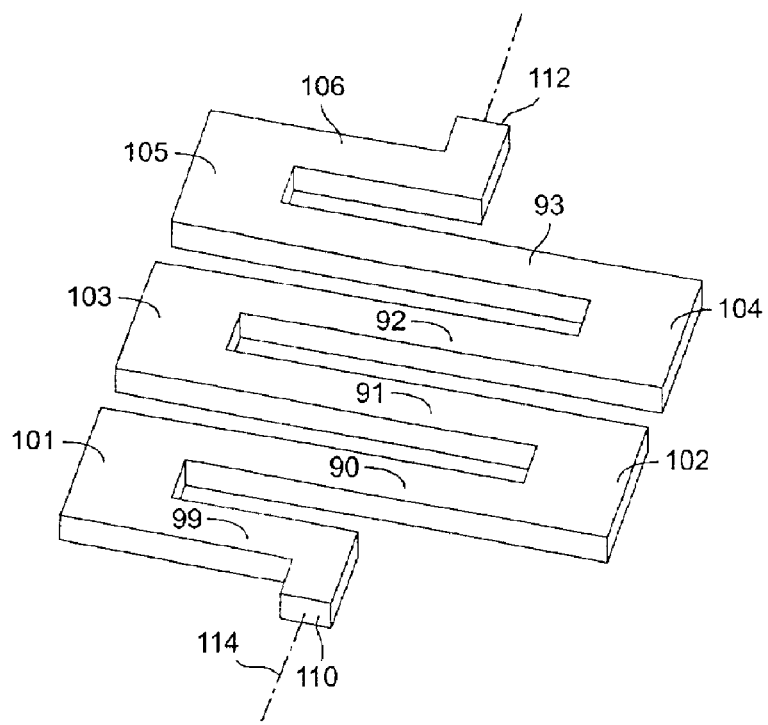
FIG. 9 is a perspective view of a transverse serpentine hinge of a type believed to be known to the art.
Figure 10:
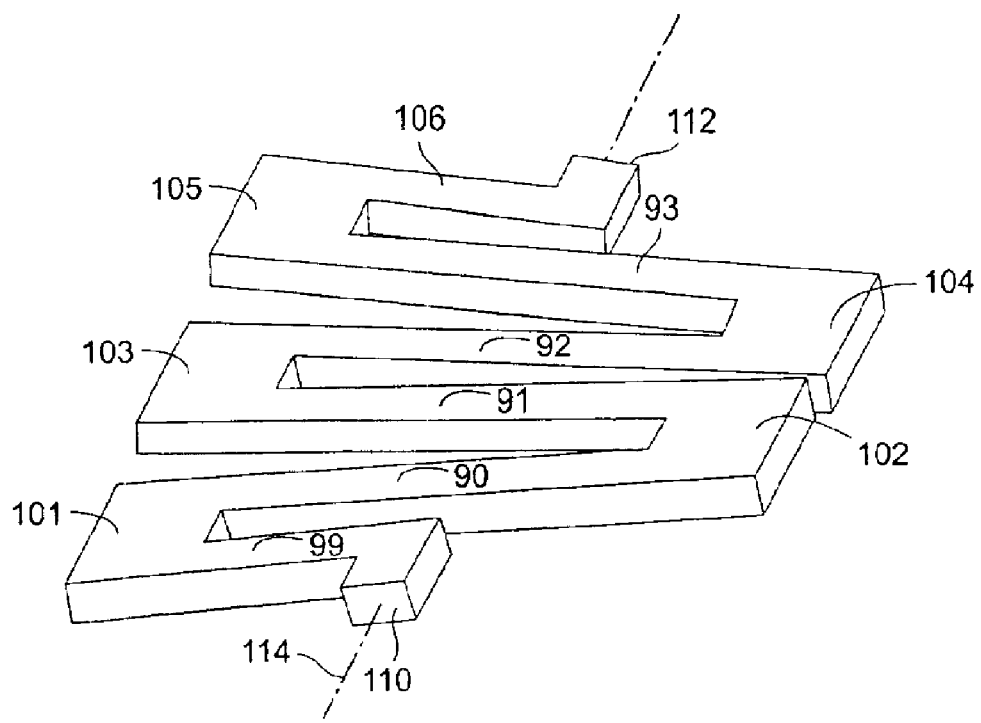
FIG. 10 is a perspective view of a transverse serpentine hinge of a type believed to be known to the art.
Figure 11:
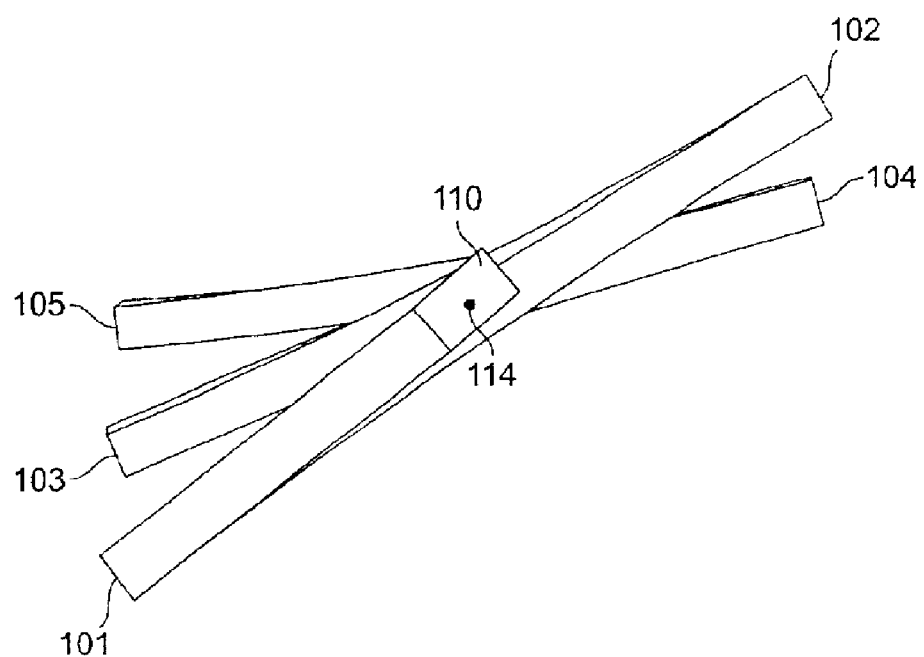
FIG. 11 is a side view of a rotated transverse hinge with the rotation exaggerated.

The second type of vertical sag motion consists of element rotation in combination with lateral expansion. FIG. 8 is a perspective view of this sag component. The following equation gives an effective vertical translational spring constant for this component:

$$k_{v2} = \frac{12Ew^3 t}{N^3 L(1+v)(w+d)^2} \left[ \frac{1}{3} - 0.21 \frac{w}{t}\left(1 - \frac{w^4}{12t^4}\right) \right]$$

where d is the distance between rungs.

The total expression for the vertical sag component is given by combining the above expressions as follows:

$$k_v = \left( \frac{1}{k_{v1}} + \frac{1}{k_{v2}} \right)^{-1}.$$

In optical switch systems in particular, and in any other systems in which these double-gimbaled mirrors may be used, the resonant frequencies of the two primary torsional modes is critically important to the performance of the device. The resonant frequency for the inner gimbal torsional mode of a circular mirror is given by the expression:

$$f_{Res} = \frac{1}{2\pi} \sqrt{\frac{2k_\theta}{I}}$$

where $$I = \frac{\pi R^4 t \rho}{4}$$

and $f_{Res}$ is resonant frequency of primary torsional mode,
I is moment of inertial of primary torsional mode,
R is mirror radius, and
ρ is mirror density.

The amount of sag has important implications in mirror design. Low-loss optical designs require mirrors ranging from 500 microns in diameter to above 1 mm in diameter. Larger mirrors have lower the resonant frequencies which results in longer switching times. One complication is mode mixing of the torsional modes with other unwanted modes. One unwanted mode, in particular, is the primary piston mode. This mode is given by oscillation in the vertical direction of the device. It can be shown that the resonant frequency of this mode is given by the equation:

$$f_{Piston} = \frac{1}{2\pi} \sqrt{\frac{g}{\Delta z_{sag}}}.$$

where $f_{Piston}$ is resonant frequency of piston mode,
$\Delta z_{sag}$ is mirror sag due to gravity,
g is gravitational acceleration.

From this analysis, it is understood that achieving small values for the sag will separate the primary torsion modes from the piston modes. Another consequence of sag is reduced tilt angles for a given design. This effect will be discussed in more detail in a later section.

Figure 12:
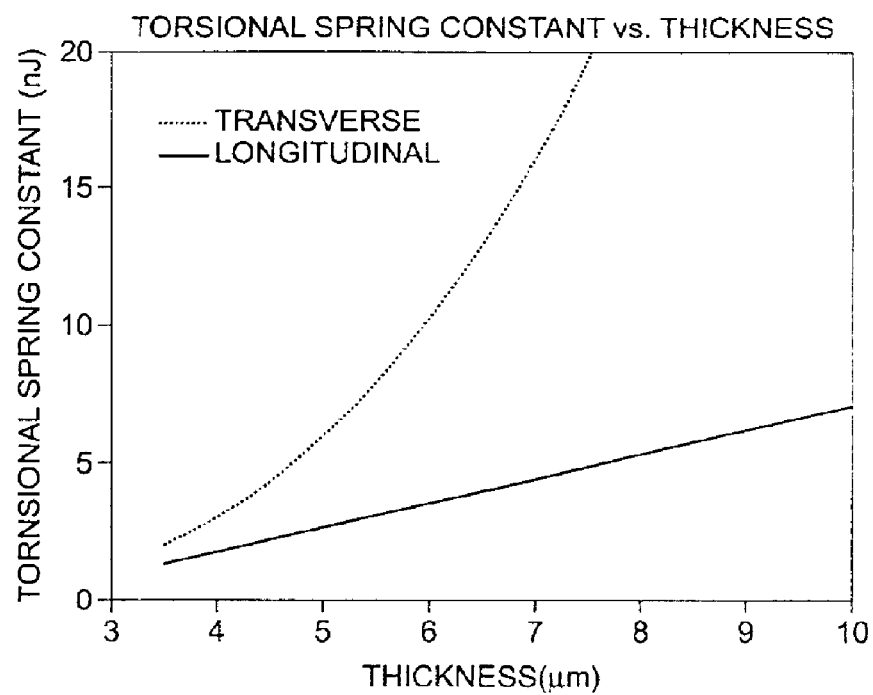
FIG. 12 illustrates torsional spring constant vs. thickness.

An important distinction to be made between the effective torsional spring constant for a longitudinal vs. transverse serpentine hinge structure is that the torsional spring constant for the longitudinal structure is cubic in width but linear in thickness, as shown in FIG. 12. In this figure, a graph of torsional spring constants vs. hinge thickness for both a representative case for a transverse hinge design and a longitudinal hinge design. The effective torsional spring constant for the transverse structure is linear in width but cubic in thickness. The cubic dependence on thickness for the transverse serpentine hinge structure has two important consequences. First, practical values for the torsional spring constant require thinner hinge thicknesses, on the order of 1 micron to 4 microns in thickness. Efficient optical switch designs require substantially flat mirrors with large radii of curvature. This typically requires mirror thicknesses of at least 5 microns and more typically 10 microns. This motivates a decoupling of the hinge thickness from the mirror thickness in fabrication, something that is not an issue for polysilicon processing but is difficult to achieve with bulk silicon processing. Second, the cubic dependence of the torsional spring constant on thickness requires tight control of this parameter. This is easily accomplished with deposition techniques, but these typically have minor stress gradients which compromise mirror flatness. Single-crystal silicon structure are typically lapped, resulting in poor thickness control resulting in higher loss for optical switch applications. Because of this, a hinge design which is less sensitive to thickness is required. The longitudinal torsional hinge is three times less sensitive to thickness than a transverse torsional hinge and is thus a better candidate for bulk silicon processes.

Figure 13:
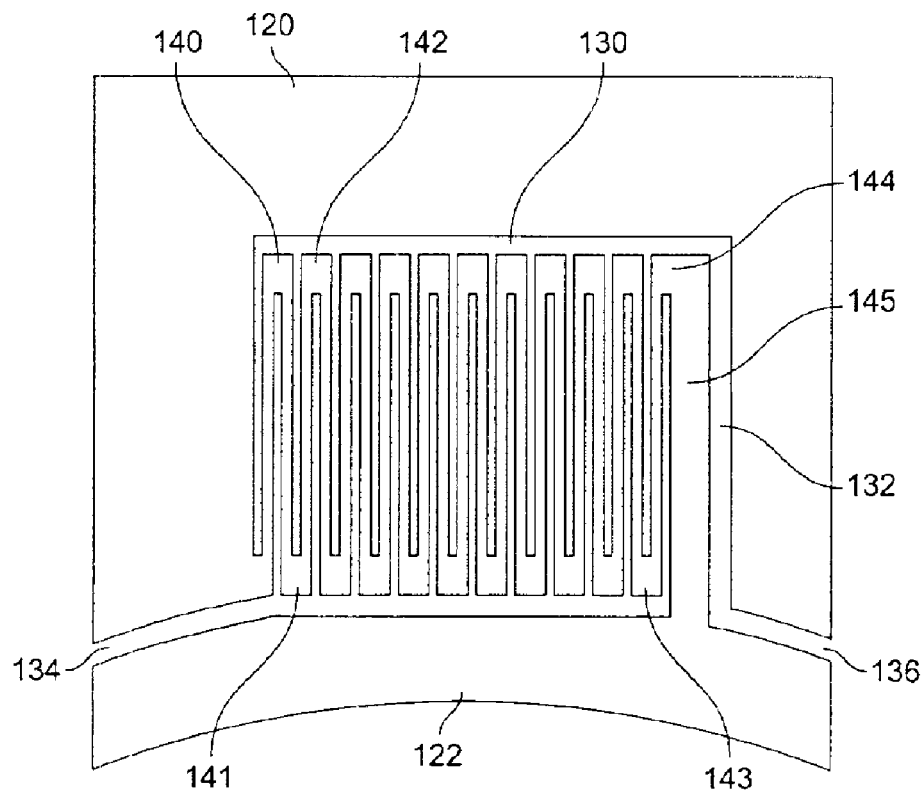
FIG. 13 is a top view of a simple longitudinal hinge with a surrounding support region and gimbal.

Reference is made to FIG. 13 in which is shown the longitudinal hinge structure fabricated in conjunction with a surrounding region 120 and a gimbal 122. According to the invention, this structure has gaps 130–136 which are wider than element gaps that would be required by a strict application of stiffness to size calculations. These regions are intended for shock compensation. With an appropriate choice of gap spacing and hinge translational spring constants, designs can be optimized to increase margin and eliminate potential contact with the surrounding regions or gimbal in the event of shock. Reference is also made to rigid braces 140–145. The size of these braces has been increased to compensate for aspect ratio-dependent etching that occurs with deep reactive ion etching of silicon. In this case, smaller regions with higher aspect ratio will etch more slowly than larger regions with smaller aspect ratios. The choices of shock compensation gaps and increased brace lengths are coupled, as increasing the gaps reduces the aspect ratio of the devices.

Figure 14:
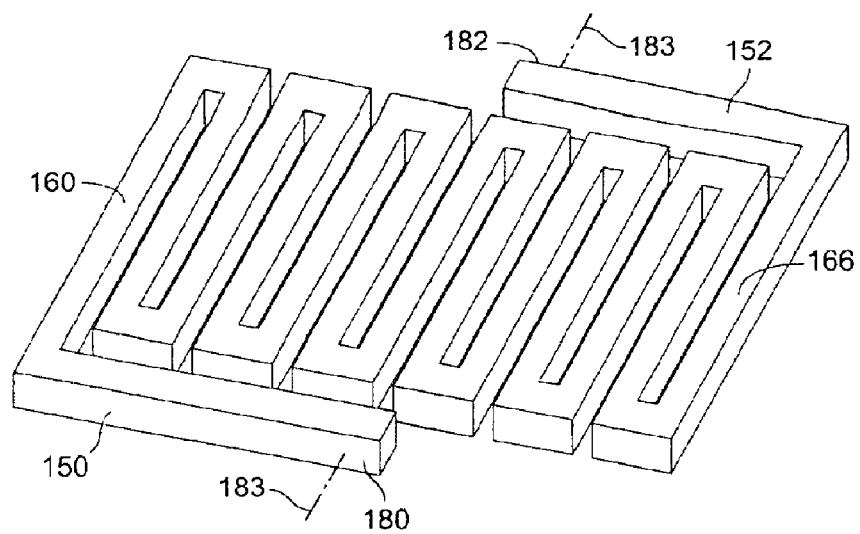
FIG. 14 is a perspective view of a simple longitudinal hinge suitable for stacking.

FIG. 14 shows a simple longitudinal serpentine hinge structure which is similar to FIG. 3 with the addition of cantilever bars 150 and 152 which are fabricated with a greater width for increased rigidity and are extended from elements 160 and 166 to the axis of rotation 183 at which there are the connection points 180 and 182 centered along the axis of rotation 183. This structure is symmetrized in such manner that multiple copies can be stacked along the longitudinal rotational axis.

Figure 15:
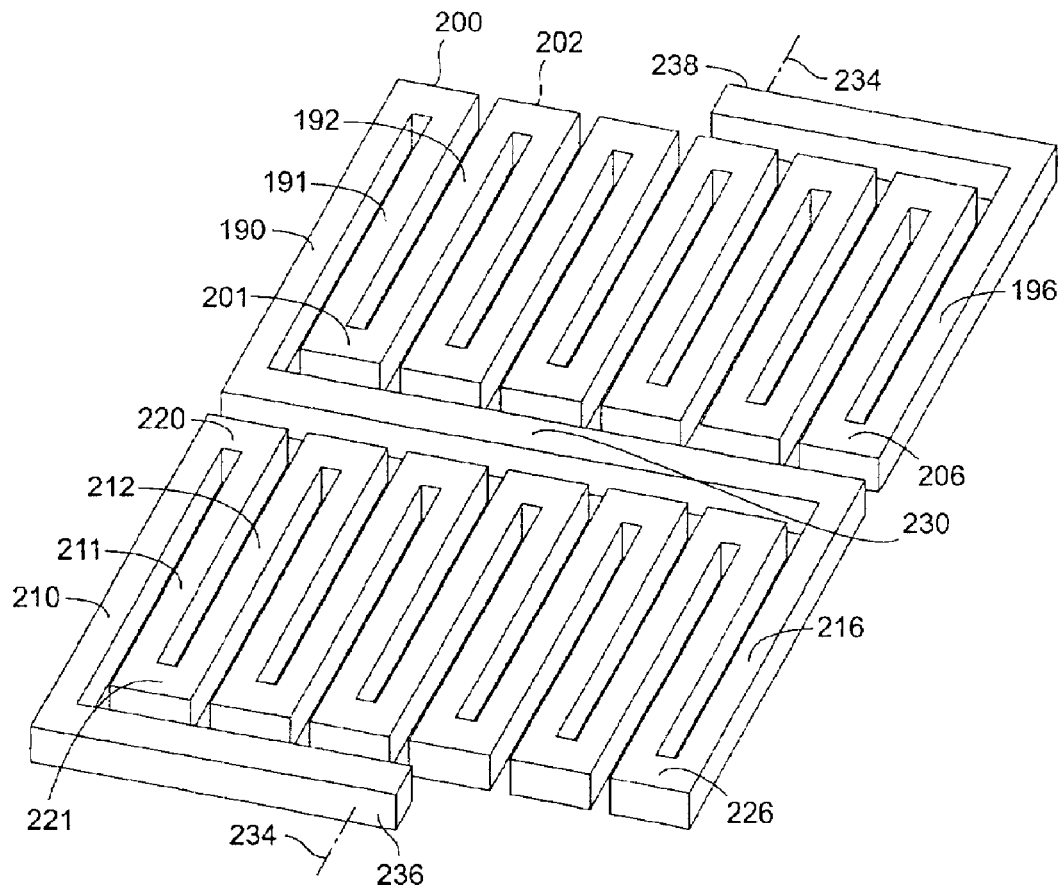
FIG. 15 is a perspective view of a doubly-stacked simple longitudinal hinge.

Reference is made to FIG. 15, in which is shown an improved hinge design according to the invention referred to as a doubly stacked simple hinge design. In this design, a plurality of torsional hinge elements 190–196 referred to as a set arranged in an array parallel to the axis of rotation are linked together in serpentine fashion by rigid lateral braces 200–206. A second set of torsional hinge elements 210–216 and rigid lateral braces 220–226 are connected by a rigid lateral brace 230. Both sets of torsional hinge elements are configured so that they are centered with the axis of rotation 234, the first set being configured to one end of the axis of rotation and the second being configured on the other end. Connection is made at connection points 236 and 238, both of which are substantially centered with the axis of rotation.

Figure 16:
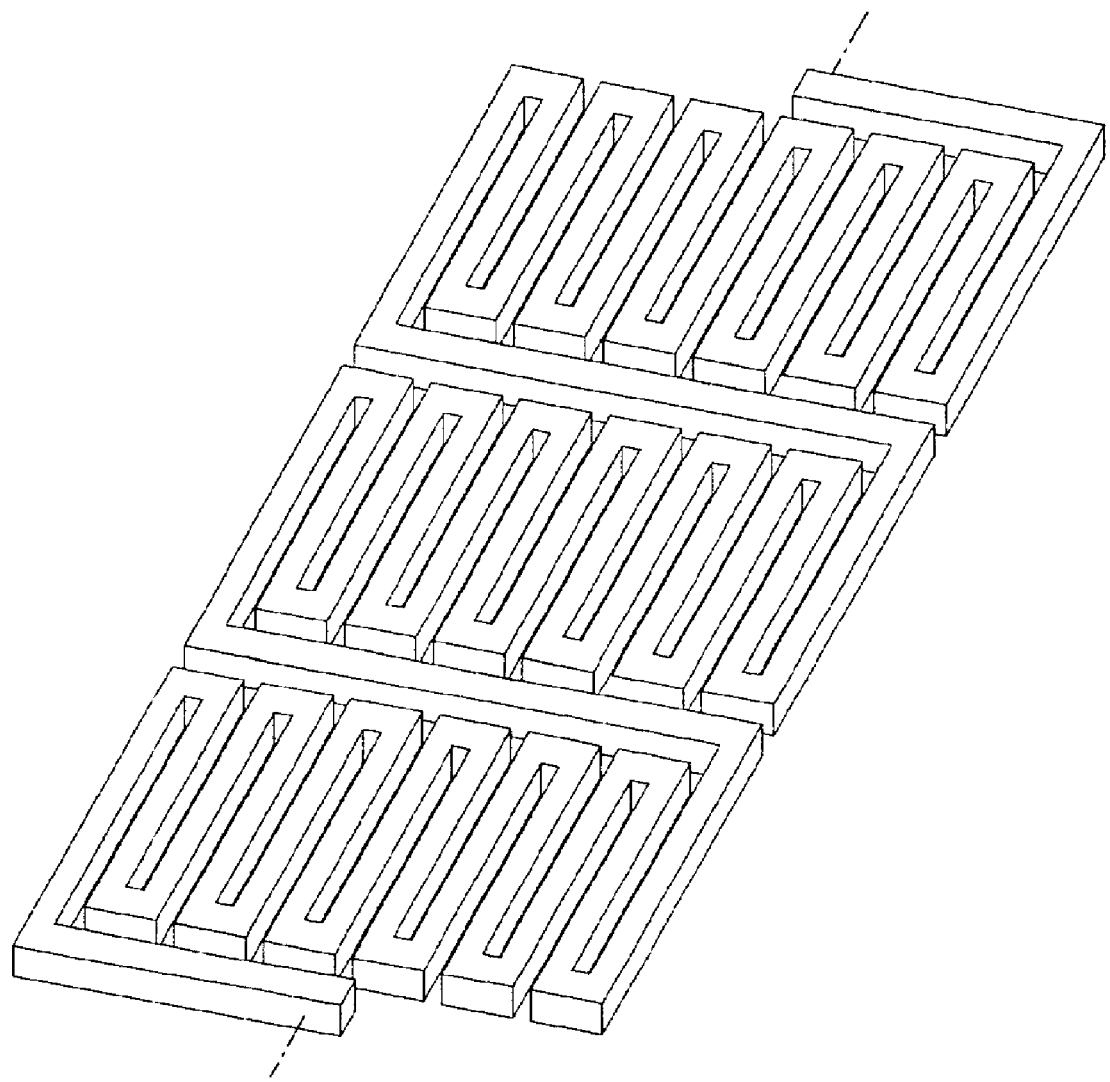
FIG. 16 is a perspective view of a triply-stacked simple longitudinal hinge.

This structure is similar to the simple longitudinal hinge structure of FIG. 3 in that the overall torsional spring constant of the stacked structure is given by taking the torsional spring constant of an individual element and dividing by the number of hinge elements. However, this structure has the advantage that for a given torsional spring constant, the rungs of the doubly stacked structure are half the length of the corresponding elements of the non-stacked structure. The significance of this effect is understood by referring to previous equations that give sag and translation due to shock. The lateral translation due to shock of the hinge elements is given by the inverse cube of the rung length, whereas the torsional spring constant is given by the inverse of the element length. Because of the cubic dependence, creating a larger number of shorter hinge elements can potentially have substantially reduced lateral movement. FIG. 16 represents a triply stacked structure. This structure will have improved translational performance than the structure of FIG. 14 at the expense of a less compact hinge design. This structure may also be more susceptible to out of plane rotations.

Figure 17:
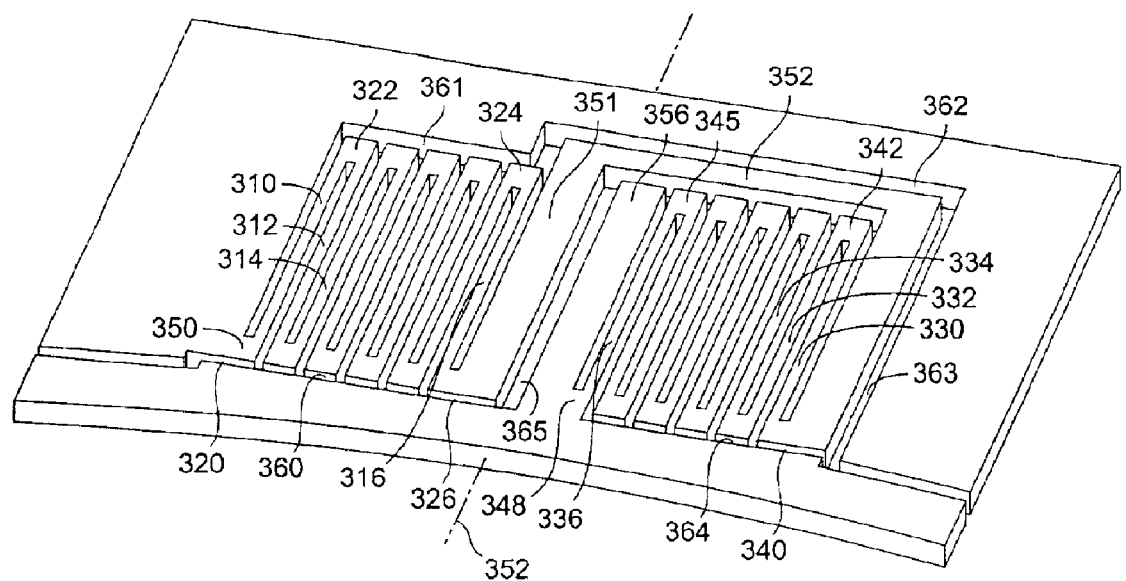
FIG. 17 is a perspective view of a compound longitudinal hinge with a surrounding support region and a gimbal according to the invention.

Reference is made to FIG. 17, in which is shown another hinge design according to the invention referred to as a compound longitudinal hinge. In this hinge design, a plurality of torsional hinge elements 310–316 forming a first set arranged in an array parallel to the axis of rotation are linked together in serpentine fashion by rigid lateral braces 320–326. A second set of torsional hinge elements 330–336 are connected together by rigid lateral braces 340–345. The first set is connected to the second set by a first rigid longitudinal brace 351 connected to a rigid lateral brace 352, which in turn is connected to a second rigid longitudinal brace 354. The first and second rigid longitudinal braces 351, 354 and the rigid lateral brace 352 form a U enclosing the second set. The rigid braces 320–326, 340–345, a finger 356, and longitudinal braces 351 and 354 are provided with a selected excess of lateral width for etch compensation which aids in the etching portion of the manufacturing process. The finger 356 provides no mechanical function in operation of the hinge. Its purpose is to protect the adjacent torsional hinge element 336 from dissolution during etching.

The widths of the inter-element gaps, particularly gaps 360–365, have been selected to permit lateral movement without contacting adjacent structure as part of device shock compensation. Both sets of torsional hinge elements are configured so that they are offset to opposite sides from the axis of rotation 352.

Connection is made at connection point 348, which is substantially centered with respect to the midpoint of the two sets of serpentine elements, and at connection point 350, which is not centered with respect to the two sets of serpentine elements. All torsional elements are oriented parallel to the axis of rotation 352, which is located at the midpoint of the two sets of serpentine elements. As with the stacked simple longitudinal hinge, this structure is similar to the simple longitudinal hinge structure of FIG. 3 in that the overall torsional spring constant is given by taking the torsional spring constant of an individual element and dividing by the number of hinge elements. However, this structure is distinguished from the simple longitudinal hinge structure of FIG. 3, in that the equations that govern sag have a different functional form, allowing specific tailoring of the relative sag to the rotational torsional spring constant.

Figure 18:
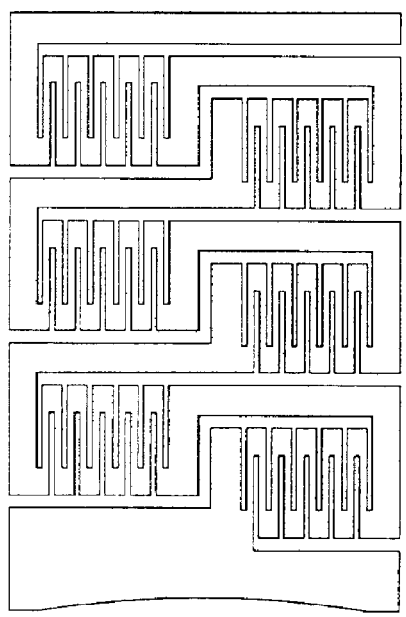
FIG. 18 is a top view of a triply-stacked compound longitudinal hinge

The significance of this effect is understood by referring to previous equations that give sag and translation due to shock. The vertical translation due to shock of the hinge elements is given by the inverse cube of the rung length, whereas the torsional spring constant is given by the inverse of the element length. Because of the cubic dependence, creating a larger number of shorter hinge elements can potentially have substantially reduced vertical movement, resulting in higher piston resonant frequencies. FIG. 18 represents a triply stacked structure compound longitudinal hinge structure. As with the structure of FIG. 15, this structure will have better translational performance than the structure of FIG. 3 at the expense of a less compact hinge design.

Assuming uniform fields, there is a well-known instability for parallel-plate electrostatically operated devices. As the voltage applied across the plates of the capacitor is increased, the plates will approach each other until a critical deflection distance $z_0/3$ is reached at which location the plates are no longer in equilibrium. The electrostatic attraction force exceeds the mechanical restoring force of the spring and the plates come together uncontrollably. A similar condition exists for a parallel-plate electrostatic double-gimbaled mirror. Referring to FIG. 1, as a voltage is applied between the mirror 12 and a lower underneath mirror 12 similar to electrode 20, a critical tilt angle is reached beyond which the mirror catastrophically impacts into the substrate. For many practical cases the critical angle is slightly higher than one third of the angle formed by the mirror in contact with the substrate.

Figure 20:
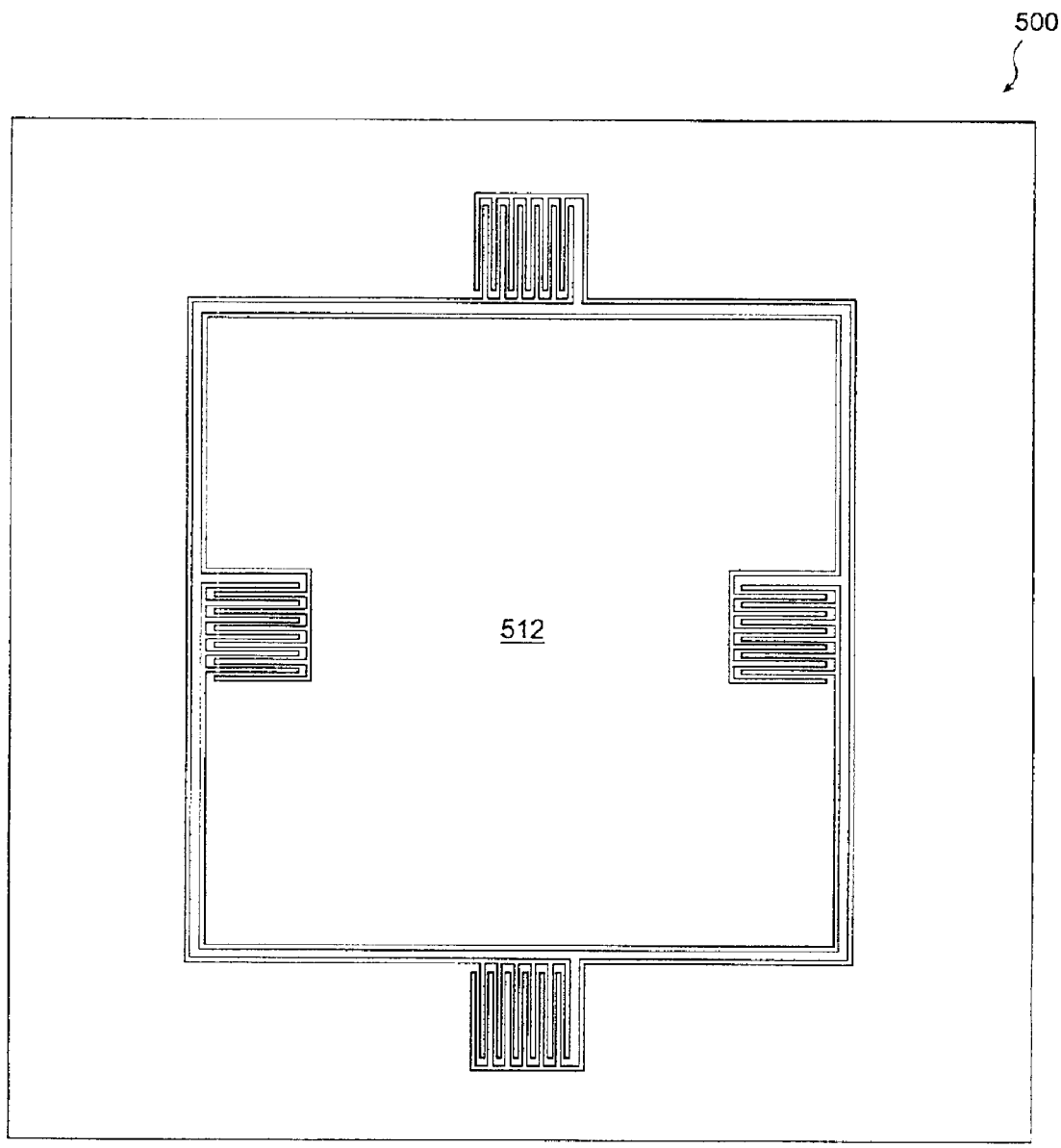
FIG. 20 is a top view of a recessed rectilinear double-gimbaled mirror with simple longitudinal hinges.

Reference is again made to the embodiment depicted in FIG. 2. A spherically symmetric, or round, mirror is the preferred embodiment for double-axis micromirrors. Compared to square or other polygonal mirrors, round mirrors are better suited to optical MEMS designs and offer higher performance under operating conditions for several important reasons. A first reason is that a round mirror 12 has a greater snap-down margin as compared to a square mirror 512 in for example a recessed squared mirror structure 500 (FIG. 20). Snap-down margin is the ratio of the tilt angle of the device in contact with the substrate to the maximum tilt angle practically achievable before the device becomes unstable. Snap-down margin is one of the important considerations in parallel-plate electrostatically actuated devices. Devices with greater snag have a reduced snap-down margin. A circle is the optimum design which maximizes surface area for a given tilt angle.

A further advantage is that a round mirror 12 better matches the generally gaussian profile of optical beams. Since the optical throughput of a system is dependent on the surface area of the mirror, a round mirror is thus better optimized for throughput considerations. The perfectly round mirror 12 of the preferred embodiment of FIG. 2 results in a mirror with little or negligible non-spherical wavefront errors in the presence of small uncontrolled residual stresses. Lastly, the potential for dielectric breakdown, or field emission, is deleteriously enhanced in polygonal mirrors (e.g. 512) due to the sharp corners at the mirror extremes, which are completely absent from round mirrors. A careful analysis of the two systems will show that the loss in tilt angle because of the corner is a greater performance degradation than the area gained.

Figure 19:
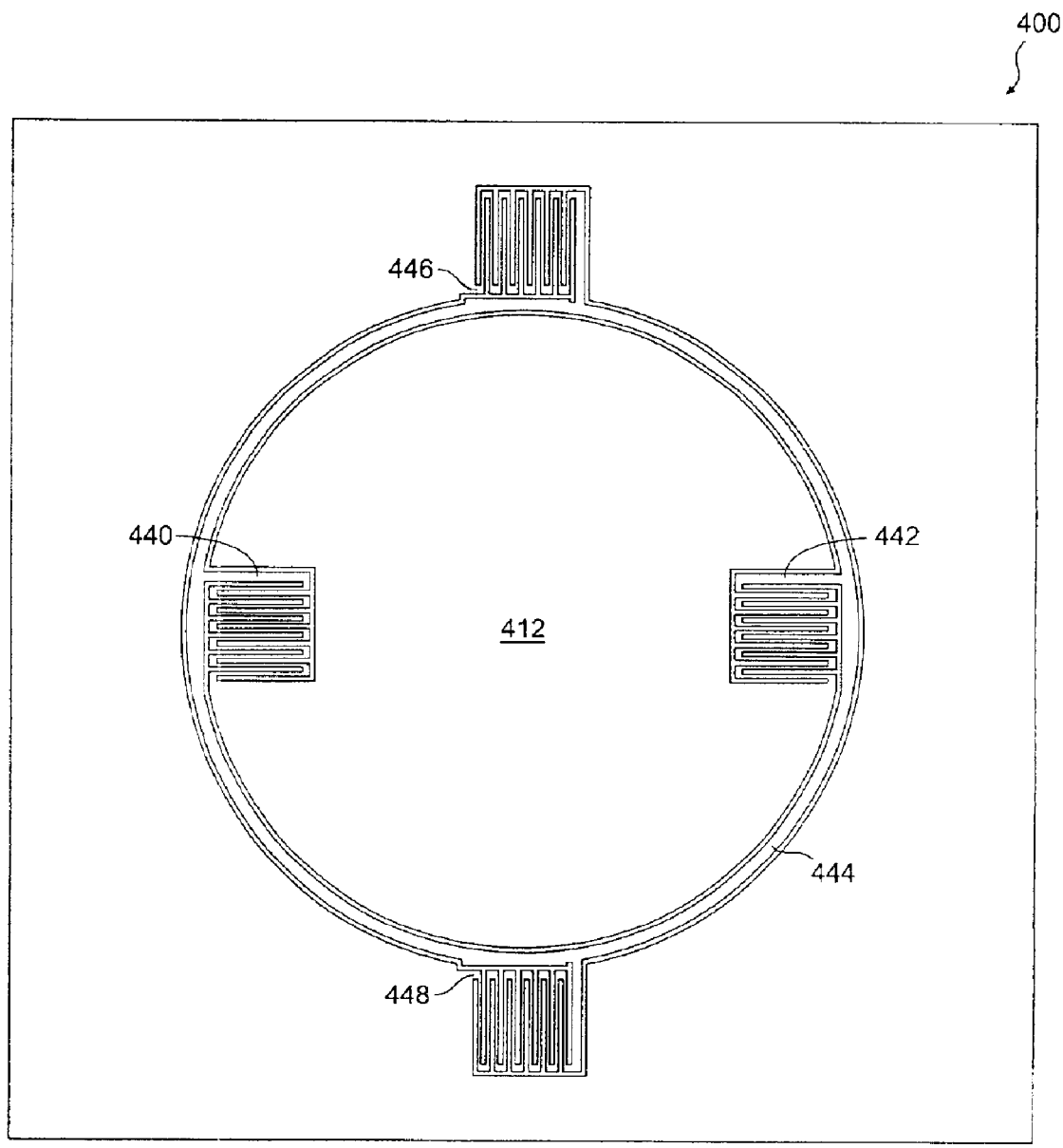
FIG. 19 is top view of a recessed circular double-gimbaled mirror with simple longitudinal hinges.

FIG. 19 depicts another possible embodiment of a longitudinal serpentine double gimbal mirror structure 400 with a round mirror 412. In this case, the inner hinges 440, 442 are recessed into the mirror 412. The advantage of the recessed mirror 412 is compactness in design. Designs which allow more efficient packing may reduce the overall size of a mirror array. Although the mirror area is reduced, smaller arrays require smaller mirror tilt angles, resulting in lower loss optical systems. Thus, the reduction of mirror aperture area and the resultant clipping at the hinges 440, 442 may be compensated elsewhere in the design. However, there is another significant disadvantage of this type of structure. Because of the notches in the mirror 412 at the hinges 440, 442, residual stresses within the mirror 412 can result in non-spherical aberrations in the mirror surface. Non-spherical asymmetries in the mirror surface profile results in wavefront error and thus lower coupling efficiencies.

Figure 21:
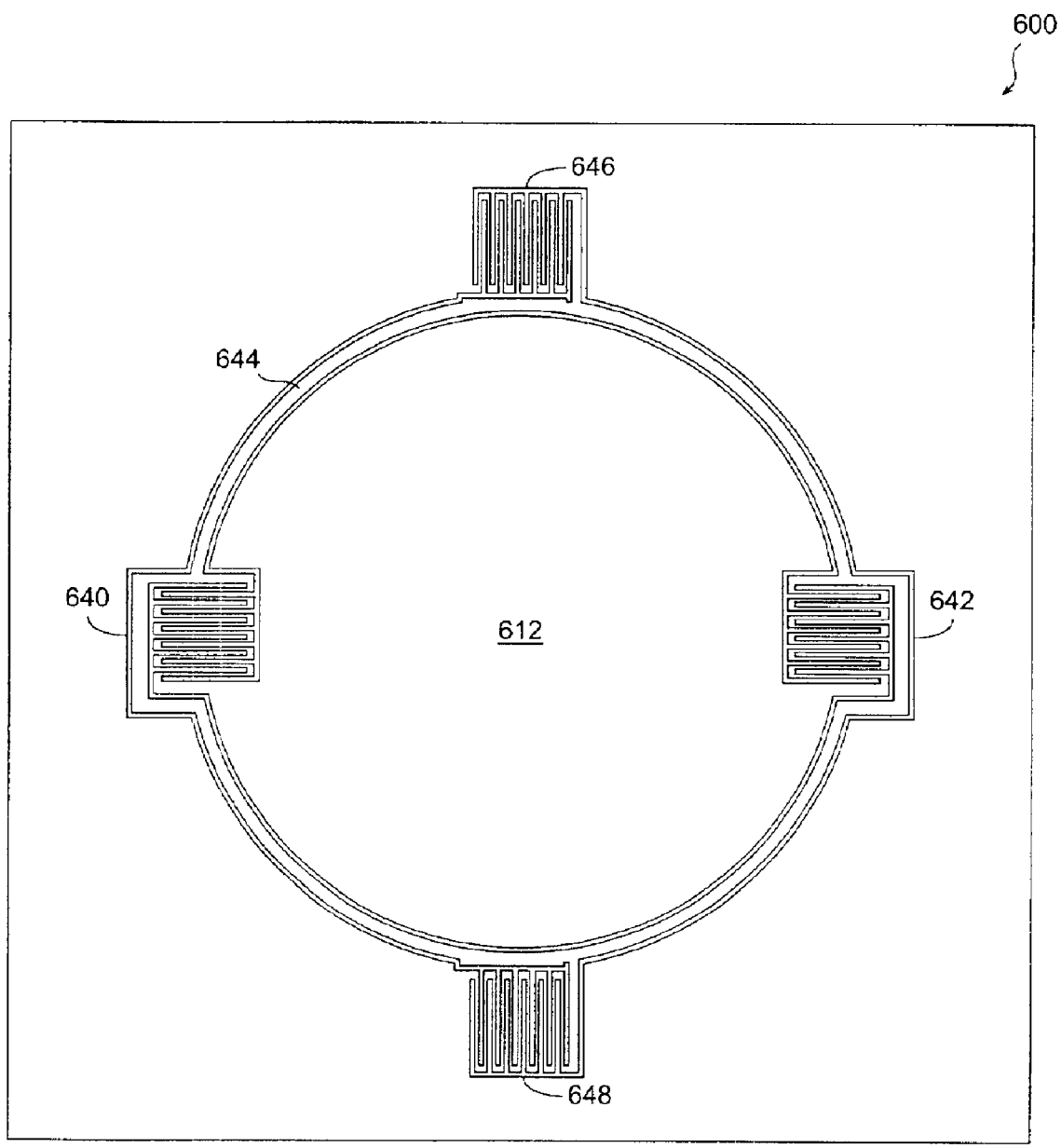
FIG. 21 is a top view of a partially recessed double-gimbaled circular mirror with simple longitudinal hinges.

FIG. 21 depicts a compromise embodiment between those of FIG. 2 and FIG. 19. In this case the mirror 612 of the assembly 600 is only partially recessed into the mirror surface. This device has the advantage of reduced wavefront errors over the device of FIG. 19, while the advantage of better compactness than the device of FIG. 2.

The type of hinge used is not limited by the type of mirror. For example, in FIG. 2, the hinges 40, 42, 46 and 48 are all symmetrically connected compound hinges in that the hinge elements are symmetric about axes through the center of the mirror and connections 36, 37 are connected to the mirror 12 along a common axis and connections 38 and 39 are connected to the gimbal 44 along a common axis. Similarly, FIG. 21 illustrates a mirror structure 600 which employs symmetrically connected simple hinges 640, 642, 646, 648.

Figure 22:
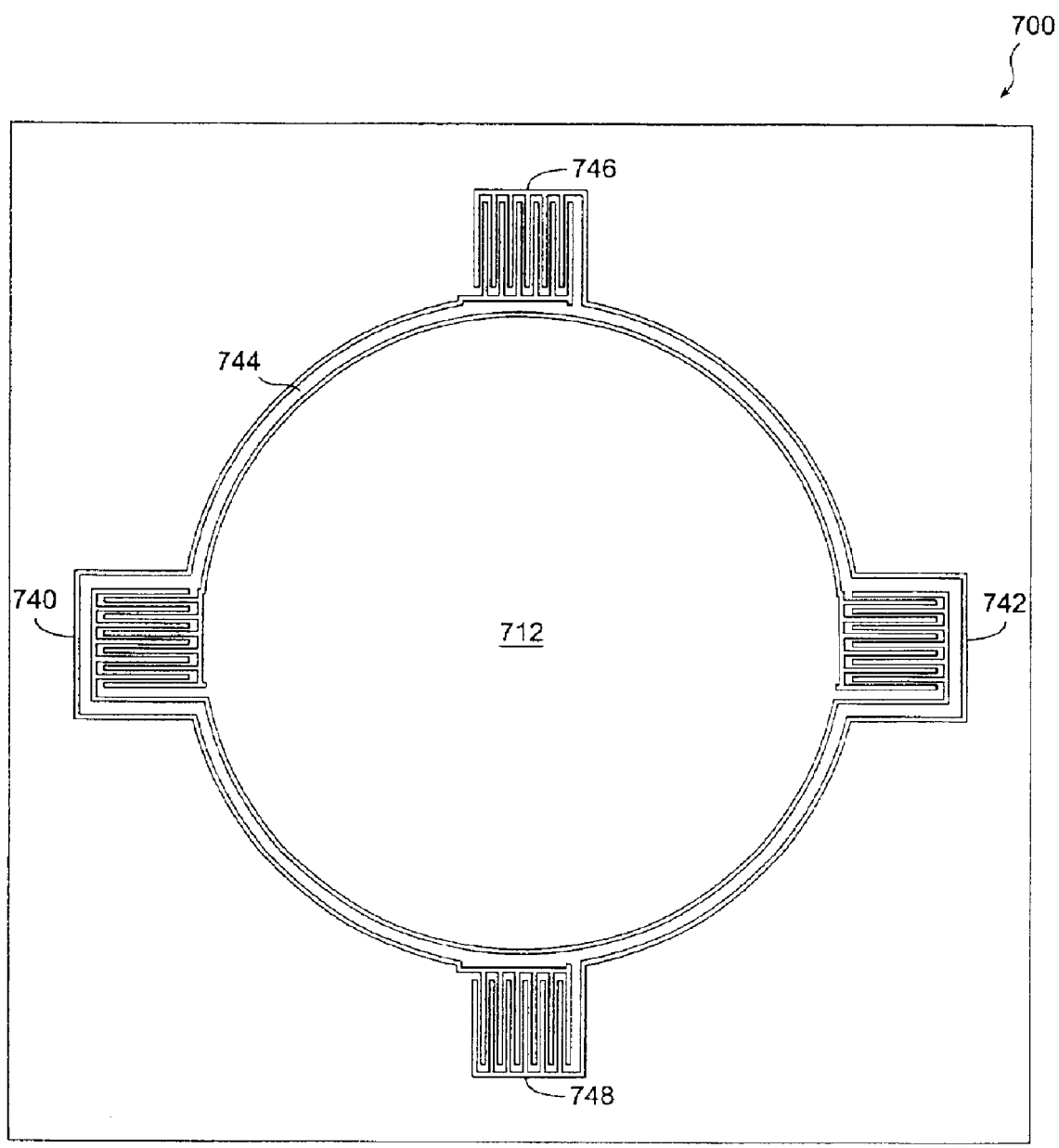
FIG. 22 is a top view of a nonrecessed circular mirror with simple longitudinal hinges.

FIG. 22 however illustrates a mirror structure 700 which employs symmetrically connected simple nonrecessed hinges 740, 742, 746, 748. Compared with the embodiment of FIG. 2, the simple hinges 740, 742, 746, 748 do not have an interstitial structure which folds back upon itself.

Figure 23:
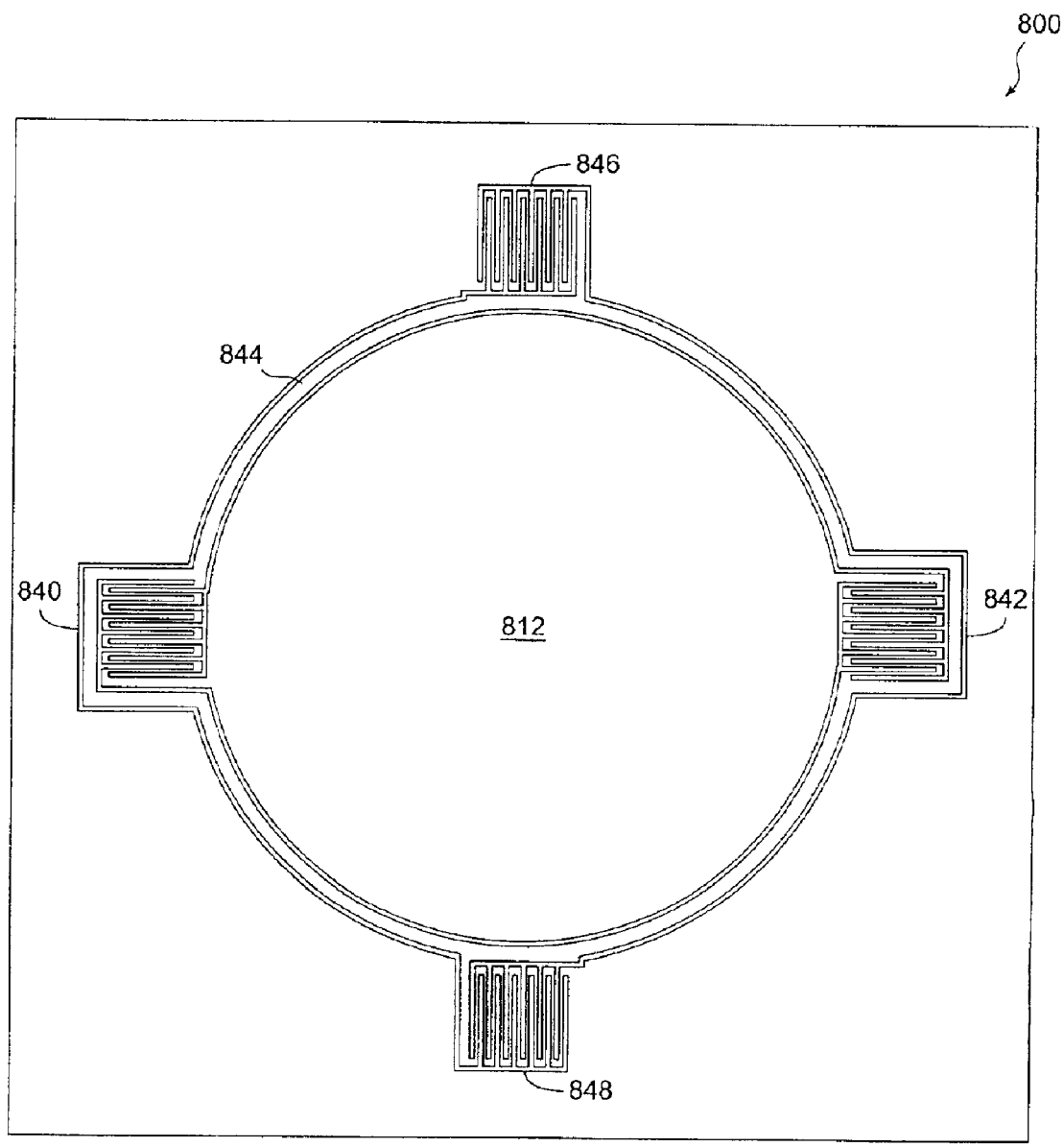
FIG. 23 is a top view of an asymmetrically connected circular mirror with simple longitudinal hinges.

FIG. 23 illustrates a mirror structure 800 with asymmetrically connected simple hinges 840, 842, 846, 848. Hinges 840, 842 are not recessed into the mirror 812, so the gimbal 844 conforms to the mirror periphery and the outer edge of the hinges 840, 842. Asymmetric hinge structures have asymmetric dynamic and static characteristics in tilt and sag. Asymmetric designs may be useful in certain types of embodiments where mechanical bias and oscillation modes unique to the designs are integrated into system dynamics. Such a discussion beyond the scope of this patent application.

Figure 24:
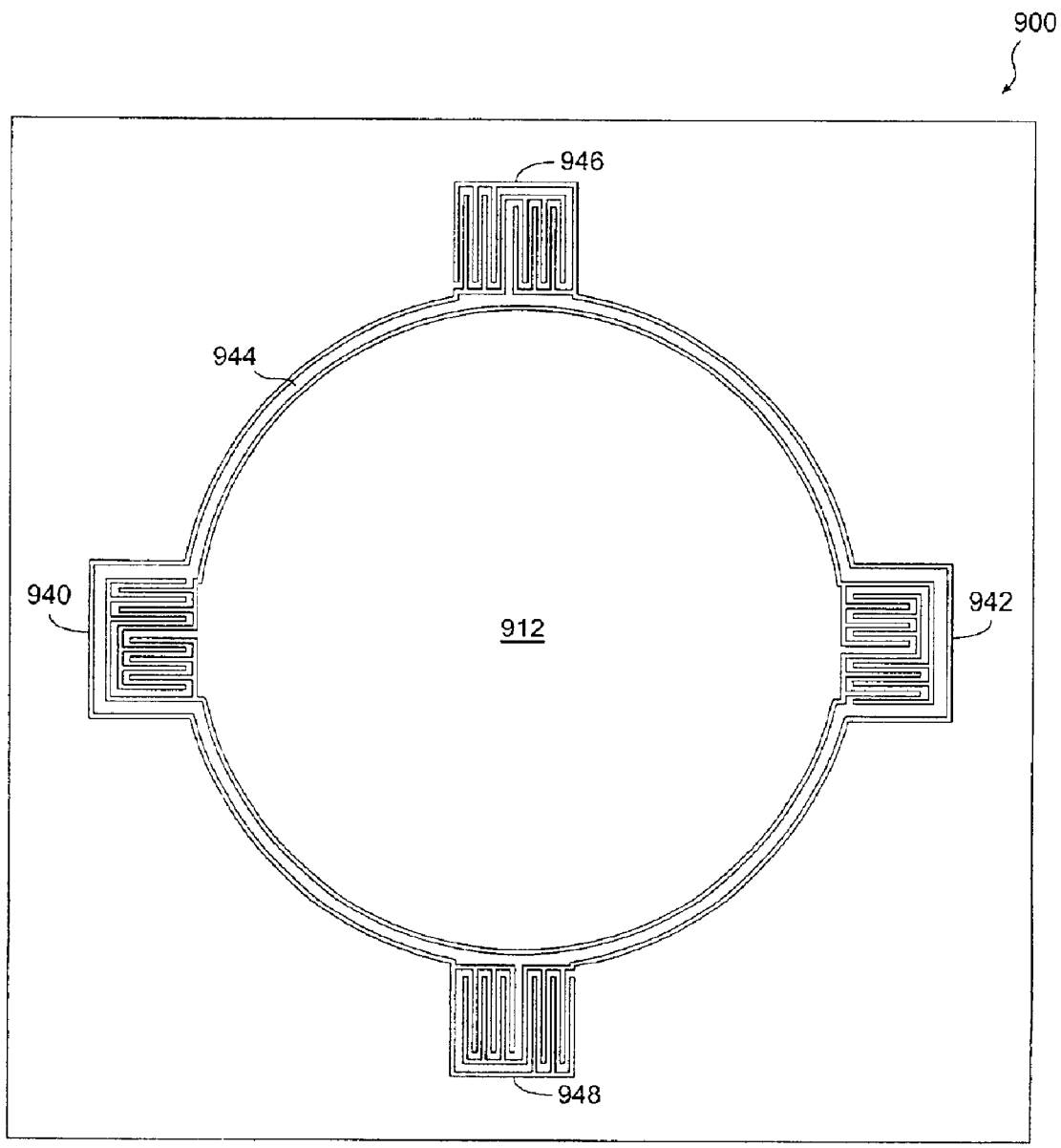
FIG. 24 is an asymmetrically connected circular mirror with compound longitudinal hinges.

FIG. 24 illustrates a mirror structure 900 with asymmetrically connected compound hinges 940, 942, 946, 948 coupled to a gimbal 944 and mirror 912. The hinges are not recessed. This design illustrates a further iteration within the scope of the invention.

The invention has been explained with reference to specific embodiments. As is apparent, other embodiments will be evident to those of ordinary skill in the art. It is therefore not intended that this invention be limited except by the appended claims.

What is claimed is:

1. A double-gimbaled micromachined mirror structure for parallel-plate electrostatic operation, said mirror structure comprising:
   a substrate of a micromirror array with embedded electrostatic electrodes;
   a mirror in said array of said substrate;
   a gimbal around said mirror; and
   a plurality of folded longitudinal gimbal hinge structures such that a plurality of torsional hinge elements are disposed in parallel orientation to the axis of rotation of each hinge structure, said folded longitudinal gimbal hinge structures being disposed at four positions on a gimbal ring, a first pair of said folded longitudinal gimbal hinge structures connecting said mirror to said gimbal and a second pair of said folded longitudinal gimbal hinge structures connecting said substrate to said gimbal.

2. The apparatus according to claim 1 wherein each said folded longitudinal gimbal hinge structure is compound.

3. The apparatus according to claim 1 wherein each said folded longitudinal gimbal hinge structure is simple.

4. The apparatus according to claim 1 wherein each said folded longitudinal gimbal hinge structure is disposed symmetrically with respect to an opposite hinge structure.

5. The apparatus according to claim 1 wherein each said folded longitudinal gimbal hinge structure disposed asymmetrically with respect to an opposite hinge structure.

6. The apparatus according to claim 1 wherein said mirror is round.

7. The apparatus according to claim 1 wherein each said folded longitudinal hinge structure is formed of stacked folded longitudinal hinges.

8. The apparatus according to claim 1 wherein said folded longitudinal gimbal hinge structures attached to the gimbal are recessed into the mirror.

9. In a double-gimbaled micromachined mirror structure for parallel-plate electrostatic operation, a simple gimbal hinge at four positions on a gimbal ring, each simple gimbal hinge comprising:
   a plurality of torsional hinge elements arranged in an array parallel to a longitudinal axis of rotation, said hinge elements being linked together in serpentine fashion by rigid braces at ends of said hinge elements;
   a first external connection point disposed off-center from the lateral edge of the array on a first side of the longitudinal axis of rotation; and
   a second external connection point disposed off-center from the lateral edge of the array on a second side of the longitudinal axis of rotation.

10. The apparatus according to claim 9 wherein:
   said hinge elements are of the same thickness as said rigid braces;
   said hinge elements have an aspect ratio of thickness to the width of the rigid braces of at least one; and wherein
   said hinge elements are of a length which is substantially greater than width and height of each said binge element.

11. The apparatus according to claim 9 further including shock compensation gaps between selected adjacent moveable elements and etch compensation material in said hinge elements and said rigid braces.

12. The apparatus according to claim 9 wherein said first external connection point of a first simple gimbal hinge is connected on the same side of said longitudinal axis as said first external connection point of a second opposing simple gimbal hinge to form a symmetrically connected gimbal mirror structure.

13. The apparatus according to claim 9 wherein said first external connection point of a first simple gimbal hinge is connected on the opposite side of said longitudinal axis as said first external connection point of a second opposing simple gimbal hinge to form an asymmetrically connected gimbal mirror structure.

14. The apparatus according to claim 9 wherein said hinge structures attached between the mirror and the gimbal are recessed into the mirror.

15. In a double-gimbaled micromachined mirror structure for parallel-plate electrostatic operation, a simple gimbal hinge at four positions on a gimbal ring, each simple gimbal hinge comprising:

a plurality of torsional hinge elements arranged in an array parallel to a longitudinal axis of rotation, said hinge elements being linked together in serpentine fashion by rigid braces at ends of said hinge elements;

a first external connection point disposed on a first cantilever element at the longitudinal axis of rotation; and a second external connection point disposed on a second cantilever element at the longitudinal axis of rotation on an opposing side of said array.

16. The apparatus according to claim 15 wherein a plurality of said simple gimbal hinges is joined at said connection points in series along said longitudinal axis to form a stacked hinge structure.

17. The apparatus according to claim 15 further including shock compensation gaps between selected adjacent moveable elements and etch compensation material in said hinge elements and said rigid braces.

18. In a double-gimbaled micromachined mirror structure for parallel-plate electrostatic operation, a stacked gimbal hinge structure at four positions on a gimbal ring, each stacked gimbal hinge structure comprising:

a first gimbal hinge, said first gimbal hinge including:
  a first plurality of torsional hinge elements arranged in a first array parallel to a longitudinal axis of rotation, said first hinge elements being linked together in serpentine fashion by first rigid braces at first ends of said first hinge elements;
  a first external connection point disposed on a first cantilever element at the longitudinal axis of rotation; and
  a second external connection point disposed on a second cantilever element at the longitudinal axis of rotation on an opposing side of said first array; and a second gimbal hinge, said second gimbal hinge including:
  a second plurality of torsional hinge elements arranged in a second array parallel to the longitudinal axis of rotation, said second hinge elements being linked together in serpentine fashion by second rigid braces at third ends of said second hinge elements;
  said third external connection point being disposed on said third cantilever element at the longitudinal axis of rotation; and
  a fourth external connection point disposed on a fourth cantilever element at the longitudinal axis of rotation on an opposing side of said second array;

wherein said external connection point is at said third external connection point and said third cantilever element is an extension of said second cantilever element.

19. The apparatus according to claim 18 wherein each said gimbal hinge is compound.

20. The apparatus according to claim 18 wherein each said gimbal hinge is simple.

21. In a double-gimbaled micromachined mirror structure for parallel-plate electrostatic operation, a compound gimbal hinge at four positions on a gimbal ring, each compound gimbal hinge comprising:

a first plurality of first torsional hinge elements arranged in a first array parallel to a longitudinal axis of rotation, said first hinge elements being linked together in serpentine fashion by first rigid braces at ends of said first hinge elements;

a second plurality of second torsional hinge elements arranged in a second array parallel to the longitudinal axis of rotation, said second hinge elements being linked together in serpentine fashion by second rigid braces at ends of said second hinge elements;

a U-shaped brace connected at a first end to said first array and at said second end to said second array for form a compound hinge structure;

a first external connection point to the first array disposed adjacent to and on a first side of the longitudinal axis; and a second external connection point to the second array disposed at the lateral edge of the second array on a second side of the longitudinal axis.

22. The apparatus according to claim 21 wherein a plurality of said compound gimbal hinges is joined at said connection points in series along said longitudinal axis to form a stacked hinge structure.

23. The apparatus according to claim 21 further including shock compensation gaps between selected adjacent moveable elements and etch compensation material in said hinge elements and said rigid braces.

24. The apparatus according to claim 21 wherein said first external connection point of a first compound gimbal hinge is connected on the same side of said longitudinal axis as said first external connection point of a second opposing compound gimbal hinge to form a symmetrically connected gimbal mirror structure.

25. The apparatus according to claim 21 wherein said first external connection point of a first compound gimbal hinge is connected on the opposite side of said longitudinal axis as said first external connection point of a second opposing compound gimbal hinge to form an asymmetrically connected gimbal mirror structure.

26. The apparatus according to claim 21 with etch compensation wherein selected ones of said rigid braces have a width greater than adjacent elements.

27. The apparatus according to claim 17 with etch compensation wherein selected ones of said rigid braces have a width greater than adjacent elements.

28. The apparatus according to claim 23 with etch compensation wherein selected ones of said rigid braces have a width greater than adjacent elements.

* * * * *